(12) United States Patent
Otremba

(10) Patent No.: US 7,053,474 B2
(45) Date of Patent: May 30, 2006

(54) SEMICONDUCTOR COMPONENT HAVING AT LEAST TWO CHIPS WHICH ARE INTEGRATED IN A HOUSING AND WITH WHICH CONTACT IS MADE BY A COMMON CONTACT CHIP

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/767,706

(22) Filed: Jan. 29, 2004

(65) Prior Publication Data

US 2004/0212057 A1 Oct. 28, 2004

(30) Foreign Application Priority Data

Jan. 29, 2003 (DE) ................. 103 03 463

(51) Int. Cl.
*H01L 23/02* (2006.01)
(52) U.S. Cl. .................... 257/685; 257/686; 257/690; 257/691; 257/692
(58) Field of Classification Search ........ 257/685–686, 257/690–692, 341
See application file for complete search history.

(56) References Cited

U.S. PATENT DOCUMENTS

| | | | |
|---|---|---|---|
| 5,719,438 A | * | 2/1998 | Beilstein et al. ............ 257/686 |
| 6,040,626 A | | 3/2000 | Cheah et al. |
| 6,697,257 B1 | | 2/2004 | Wolf et al. |
| 6,784,488 B1 | * | 8/2004 | Huang et al. ................ 257/330 |
| 2001/0044167 A1 | | 11/2001 | Kuo |
| 2003/0042587 A1 | * | 3/2003 | Lee ............................ 257/678 |

FOREIGN PATENT DOCUMENTS

| | | |
|---|---|---|
| EP | 0 069 971 | 1/1983 |
| EP | 0 827 201 | 3/1998 |
| EP | 0 962 975 | 12/1999 |
| JP | 58-95853 | 6/1983 |
| JP | 3-85755 | 4/1991 |
| JP | 07130949 | 5/1995 |
| JP | 2000082721 | 3/2000 |

\* cited by examiner

*Primary Examiner*—Donghee Kang
(74) *Attorney, Agent, or Firm*—Dicke, Billig & Czaja, PLLC

(57) ABSTRACT

A semiconductor component, featuring a housing, at least two semiconductor chips arranged in the housing, which chips in each case have a front side and a rear side and in each case have at least one contact area at the front and/or rear side, at least one contact clip, which projects from the housing, within the housing, and which has a plate-type section with a first and a second connection area which are opposite one another, and which makes contact with at least two of the chips, its first connection area being applied to the contact area of at least one of the chips and its second connection area being applied to the contact area of at least another of the chips.

18 Claims, 5 Drawing Sheets

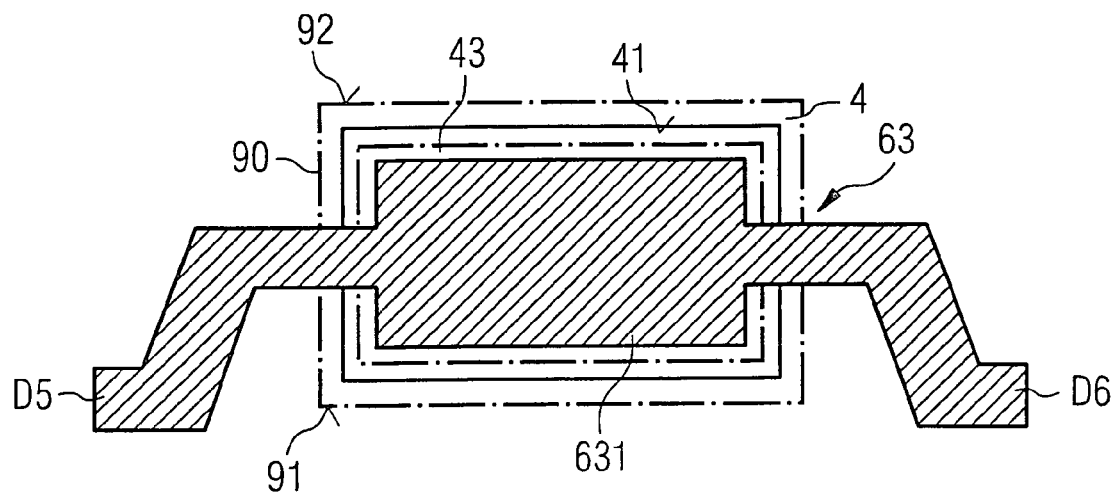
FIG 2 A-A
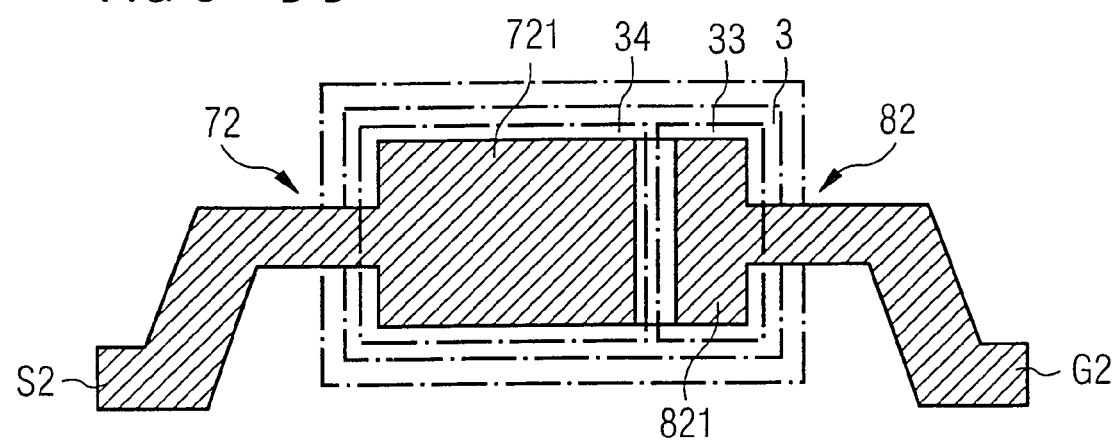
FIG 3 B-B

SEMICONDUCTOR COMPONENT HAVING AT LEAST TWO CHIPS WHICH ARE INTEGRATED IN A HOUSING AND WITH WHICH CONTACT IS MADE BY A COMMON CONTACT CHIP

CROSS-REFERENCE TO RELATED APPLICATIONS

This Utility Patent Application claims priority to German Patent Application No. DE 103 03 463.3, filed on Jan. 29, 2003, which is incorporated herein by reference.

BACKGROUND

The present invention relates to a semiconductor component having at least two semiconductor chips which are integrated in a housing.

EP 0 827 201 A2 describes a semiconductor component in which three chips are integrated in a housing, two of the chips being arranged at a distance from one another on contact areas of the further chip, which is seated on a carrier. In this case, contact connections of the three chips are bonded by means of bonding wires to connection legs which project from the housing. The connection legs are bent downward and reach right underneath the housing in order to be able to mount the component on a circuit board.

U.S. Pat. No. 6,040,626 and US 2001/0044167 describe semiconductor components each having a semiconductor chip integrated in a housing, contact areas of said chip being connected to connection legs projecting from the housing by means of so-called contact clips.

EP 0 962 975 A2 and JP 2000082721 A likewise describe semiconductor components each having a semiconductor chip which is integrated in a housing and with whose contact areas contact is made by means of contact clips, the contact clips projecting from the housing and simultaneously serving as connection legs.

Making contact with chip connections by means of bonding wires connected at the other end to connection legs of the housing is costly in terms of space since a certain housing height for the bonding wires running in arcuate fashion is necessary above the chip, which has the effect that a not inconsiderable part of the housing volume remains largely unutilized except for the bonding wires.

SUMMARY

One embodiment of the present invention is a semiconductor component having at least two semiconductor chips integrated in a housing in which an available housing volume is utilized better, so that either a more compact design is achieved or a component having a larger chip area can be realized for a given housing volume.

The semiconductor component according to one embodiment of the invention comprises a housing, at least two semiconductor chips arranged in the housing, which chips in each case have a front side and a rear side and also in each case have at least one contact area at the front and/or rear side. The component furthermore comprises at least one contact clip, which projects from the housing and which has a plate-type section with a first and a second connection area which are opposite one another, and at least one connection leg located outside the housing. The plate-type section of the at least one contact clip serves for producing an electrically conductive contact with the contact areas of the chips, it being provided that the first connection area of the contact clip is applied to the contact area of at least one of the chips and the second connection area of said contact clip is applied to the contact area of at least another of the chips. As a result of this, both sides of the plate-type contact section of the contact clip are utilized for making contact with semiconductor chips, the respective contacts of the semiconductor chips being connected to one another by the contact clip and the contact clip, via its connection leg, simultaneously forming a connection for the two chips which is accessible from outside the housing.

The use of a contact clip which makes contact with semiconductor chips on both sides and forms an external connection for the two semiconductor chips with which contact is made enables a particularly compact design of the semiconductor component with the at least two semiconductor chips.

Particularly good space utilization of a given housing volume can be achieved if a plurality of semiconductor chips are integrated in the housing, said chips being rotated through 90° with respect to the customary mounting direction of semiconductor chips in housings. Conventional housings for semiconductor components, for example housings of the P-DSO type, are flat and have a top side and an underside, the areas of which are large in comparison with the remaining side areas. In housings of this type, semiconductor chips have hitherto been mounted such that the front and rear sides of the chips lie approximately parallel to the top side and underside of the housing.

In one embodiment of the invention, the semiconductor chips are integrated in the housing in such a way that their front and rear sides run approximately perpendicularly to the top side and underside of the housing. This enables the integration of a plurality of semiconductor chips, the area of which is less than the cross-sectional area of the housing, in a housing with very good space utilization.

This procedure of accommodating a plurality of chips in the housing perpendicularly to the top side and underside of the housing and of making contact with in each case two chips by means of a common contact clip is of interest for power components in SiC technology. In the case of wafers in SiC technology from which the later components are generated, the defect density is currently still very high in comparison with wafers in Si technology, so that only chips of small area can be produced for a tenable yield. With an increasing chip size, the rejects per wafer would rise considerably. According to one embodiment of the invention, it is now possible to integrate a plurality of chips of small area, for example diodes or transistors, in the housing with optimum space utilization and to connect them in parallel via the contact clips and external circuitry of the connection legs of the contact clips, in order thereby to obtain overall a component with a large chip area.

One embodiment provides for the at least one contact clip to exit from the housing at a side adjoining the underside toward the side and to have a bent section which, below the underside, forms the connection contact of the connection leg, in order to be mounted on a circuit board, for example, by means of said connection leg.

A further embodiment provides for the at least one contact clip to exit from the housing at the underside in order to form a connection leg.

In one embodiment, power transistors are integrated in the at least two chips, the chips in each case having three contact areas: a gate contact area, a source contact area and a drain contact area. The gate contact areas and the source contact areas are arranged, for example, in each case at the front sides and the drain contact areas are arranged in each case at the rear sides of the semiconductor chips.

Depending on the intended application, the two semiconductor chips with which contact is made by a contact clip and which are connected to one another may be arranged in such a way that the contact clip makes contact with the rear sides of the two chips in order, in the case of transistors, by way of example, to make contact with the drain terminals thereof and to connect them to one another, that the contact clip makes contact with the front sides of the two chips in order, in the case of transistors, by way of example, to make contact with the source terminals or gate terminals thereof, or that the contact clip makes contact with the front side of one chip and the rear side of the other chip in order, in the case of transistors, by way of example, to connect the source terminal of one chip to the drain terminal of the other chip. In the case of diode chips, series circuits or parallel circuits of diodes can be produced in a corresponding manner.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a cross section through the component in accordance with FIG. 1 in a sectional plane A—A.

FIG. 3 illustrates a cross section through the semiconductor component in accordance with FIG. 1 in a sectional plane B—B.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 4:
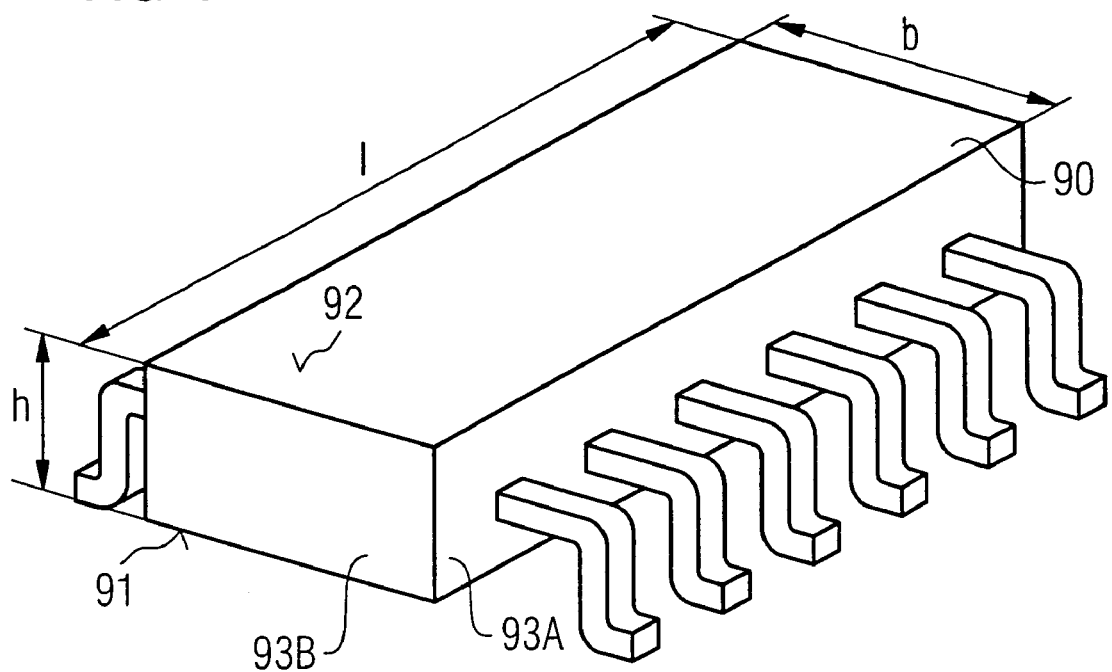
FIG. 4 illustrates a perspective view of the component in accordance with FIG. 1 with the housing shown closed in the illustration.

FIGS. 1–4 illustrate a first exemplary embodiment of a semiconductor component according to the invention, which, in the example, comprises five semiconductor chips 1–5 which are integrated together in a housing 90. FIG. 4 illustrates this housing 90, which has an underside 91 and a top side 92, in a perspective illustration. The geometry of this flat housing 90 illustrated is such that the area of the underside 91 and of the top side 92 is greater than in each case the areas of the side walls 93A, 93B, or that a height h between underside 91 and top side 92 is less than a width b and a length l of the housing 90. In the present case, the top side 92 and the underside 91 designate the sides which, when the component is mounted onto a circuit board, lie parallel to the mounting plane of the circuit board, which mounting plane has contact connections.

Figure 1:
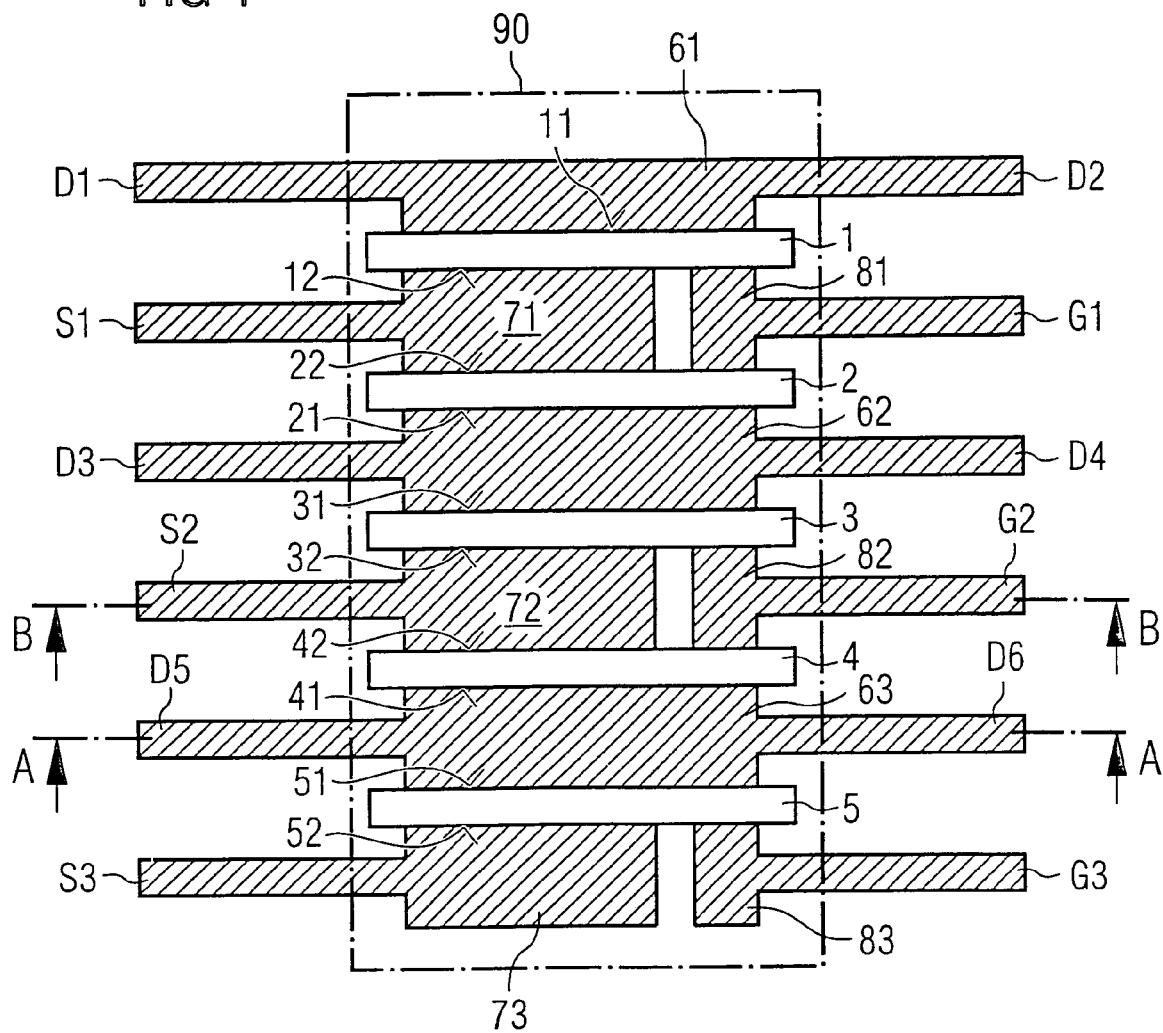
FIG. 1 illustrates a semiconductor component with a plurality of semiconductor chips integrated in a housing, in plan view.

FIG. 1 illustrates a cross section through the semiconductor component in plan view from above, the housing 90 being illustrated merely in dash-dotted fashion in FIG. 1.

In the example, the component comprises five semiconductor chips 1–5, which in each case have a front side 12, 22, 32, 42, 52 and a rear side 11, 21, 31, 41, 51. In the exemplary embodiment, the semiconductor chips 1–5 are in each case formed as transistor chips. In one embodiment, a power MOSFET is integrated as each transistor and in each case have, at their rear side 11, 21, 31, 41, 51, a drain contact area 43, as is illustrated on the basis of the semiconductor chip 4 in FIG. 2, and, at their front sides 12, 22, 32, 42, 52, in each case have a gate contact area 33 and a source contact area 34, as is illustrated on the basis of the semiconductor chip 3 in FIG. 3.

The semiconductor chips 1–5 are accommodated in the housing in such a way that their front and rear sides are at least approximately perpendicular to the top side and underside 92, 91 of the flat housing 90. In each case, contact is made with two of the semiconductor chips 1–5 by a common contact clip 61–63, 71–73, 81–83. In the example, each of said contact clips 61–63, 71–73, 81–83 project from the housing 90 and form a connection leg D1–D6, G1–G3, S1–S3 at the section outside the housing, via which legs the component can, for example, be soldered to connection points on a circuit board or be electrically conductively connected in another way.

The semiconductor chips 1–5 are arranged in the housing one after the other in the longitudinal direction thereof such that the front sides and rear sides of two adjacent chips alternately face one another. Thus, the front side 12 of the semiconductor chip 1 faces the front side 22 of the semiconductor chip 2, the rear side 21 of the semiconductor chip 2 faces the rear side 31 of the semiconductor chip 3, the front side 32 of the semiconductor chip 3 faces the front side 42 of the semiconductor chip 4, etc.

In the example, the semiconductor chips 1 and 2 are arranged in such a way that their front sides 12, 22 face one another, contact being made with source connection areas at said front sides 12, 22 by the contact clip 71 arranged between these semiconductor components 1, 2 and said source connection areas being electrically conductively connected to one another. Correspondingly, contact is made with gate connection areas of the semiconductor chips 1, 2 by means of a contact clip 81, which is likewise arranged between said semiconductor chips 1, 2, and said gate connection areas are thereby conductively connected to one another. The connection leg S1 of the contact clip 71 forms a common source terminal of the two semiconductor chips 1, 2, and the connection leg G1 of the contact clip 81 forms a common gate terminal of the two semiconductor chips 1, 2. In a corresponding manner to that in the case of the semiconductor chips 1, 2, a contact clip 72 makes contact with source connection areas at the front sides 32, 42 of the semiconductor chips 3, 4, the front sides 32, 42 of which face one another, a connection leg S2 forming a common source terminal of said semiconductor chips 3, 4, and a further contact clip 82 makes contact with the gate connection areas (reference symbol 33 in FIG. 3) of the semiconductor chip 3 and of the semiconductor chip 4, a connection leg G2 of said further contact clip 82 forming a common gate terminal G2 of the semiconductor chips 3, 4.

A further source contact clip 73 only makes contact with the source connection area at the front side 52 of the semiconductor chip 5, and a further gate contact clip 83 only makes contact with the gate connection area at the front side 52 of the said semiconductor chip 5.

As can be gathered from the contact clip G3 in FIG. 2 and the contact clips 72, 82 in FIG. 3, the contact clips in each case have a plate-type section 631, 721, 821 having, on both sides, connection areas for making contact with the contact areas of the semiconductor chips.

In a corresponding manner to the way in which a source contact clip 71, 72 makes contact with the source connection areas of two adjacent chips 1, 2 and 3, 4, respectively, and a gate contact clip 81, 82 makes contact with the gate connection areas of two adjacent chips 1, 2 and 3, 4, respectively, a common growing contact clip makes contact with the drain connection areas of two adjacent chips. In the example, a common drain contact clip 62 makes contact with the drain contact areas at the rear sides 21, 31 of the adjacent semiconductor chips 2, 3, said contact clip having two connection legs D3, D4, which project from the housing 90 at opposite sides and which form common drain terminals of the semiconductor chips 2, 3. In a corresponding manner, a common drain contact clip 63 makes contact with drain contact areas at the rear sides 41, 51 of the semiconductor chips 4, 5, said drain contact clip likewise having connection legs D5, D6 which project from the housing 90 at opposite ends. A further drain contact clip 61 makes contact with the rear side 11 of the semiconductor chip 1 arranged at one end of the chip/contact clip stack formed by the chips 1–5 and the contact clips 61–63, 71–73, 81–83, which further drain contact clip only makes contact with said semiconductor chip 1 and likewise has two connection legs D1–D2 which exit from the housing at opposite ends.

As can be gathered from FIGS. 2 and 3, in particular, the connection legs D1–D6, S1–S3, G1–G2 are bent downward in order to be able to place the semiconductor component onto a circuit board by the connection legs. The contact clips 61–63, 71–73, 81–83 may already be produced with such angled connection legs. It is furthermore possible to produce the contact clips 61–63, 71–73, 81–83 in such a way that the connection legs D1–D6, S1–S3, G1–G3 initially project horizontally from the housing 90, the connection legs being bent into the desired form only at the end of mounting.

Figure 5:
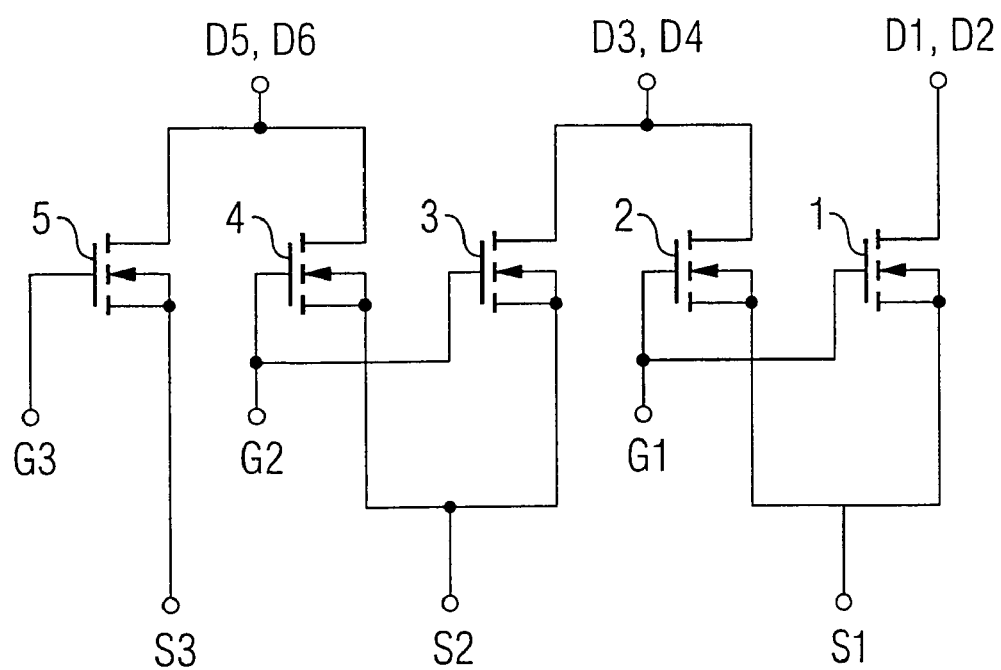
FIG. 5 illustrates an electrical equivalent circuit diagram of the component in accordance with FIGS. 1 to 4 when using transistor chips.

FIG. 5 illustrates the electrical equivalent circuit diagram of the semiconductor component explained with reference to FIGS. 1–4 and illustrated under the assumption that the semiconductor chips 1–5 are power transistor chips in each of which a MOSFET is integrated. As has already been explained, the transistors of the semiconductor chips 4, 5 have a common drain terminal formed by the connection legs D5, D6 and the transistors of the semiconductor chips 2, 3 have a common drain terminal formed by the connection legs D3, D4. The transistors of the semiconductor chips 1 and 2 and also 3 and 4 in each case have common source terminals formed by the connection legs S1 and S3, respectively, and common gate terminals G1, G2 formed by the connection legs G1, G2. Through external connections on a circuit board, it is possible, in a simple manner, for all the drain terminals of the semiconductor chips to be connected to one another, all the source terminals of the semiconductor chips to be connected to one another and all the gate terminals of the semiconductor chips to be connected to one another, in order thereby to obtain five power transistor chips connected in parallel with a correspondingly high dielectric strength. In order to afford a better understanding, the terminals of the equivalent circuit diagram are designated by the reference symbols of the connection legs that form these terminals and the transistors are designated by the reference symbols of the corresponding chips.

The particularly good space utilization in the case of the semiconductor component explained with reference to FIGS. 1–4 is explained below using an example.

In one embodiment of the invention, the housing is a standard housing of the P-DSO-12 type having a housing height h of 2.6 mm, a housing width of 7.5 mm and a housing length of 6.4 mm. In the case of conventional mounting in the case of which the front side and rear side of a semiconductor chip lie parallel to the top side and underside, and in the case of which contact areas of the semiconductor chips are bonded to connection legs, it is possible to integrate semiconductor chips with a chip area of 13.3 mm² in the housing. In such a housing, however, in the case of an arrangement according to the invention as shown in FIGS. 1–3, it is also possible to integrate five chips each having a chip area of 1.6×4.6 mm², which corresponds to a total chip area of 36 mm². Taking account of the fact that, in power transistors, the dielectric strength thereof is proportional to the chip area thereof, a power transistor formed from a plurality of power transistors connected in parallel can thus be realized in a standard housing, which power transistor may have a significantly higher dielectric strength. Such an arrangement with a plurality of small semiconductor chips that are perpendicular in the housing is of interest in particular for components in SiC technology, since, in the case of this technology, hitherto then the chips of small area have been able to be produced with a tenable yield.

The contact clips 61–63, 71–73 and also 81–83 are applied to the contact areas of the semiconductor chips 1–5 by means of conventional methods, for example by means of soldering, by means of an electrically conductive adhesive or else by pressing together the entire chip/contact clip stack. The housing 90 is produced in a conventional manner by the entire arrangement with the chip contact clip and the contact clips situated in between being encapsulated with a housing molding composition by injection molding.

Figure 6:
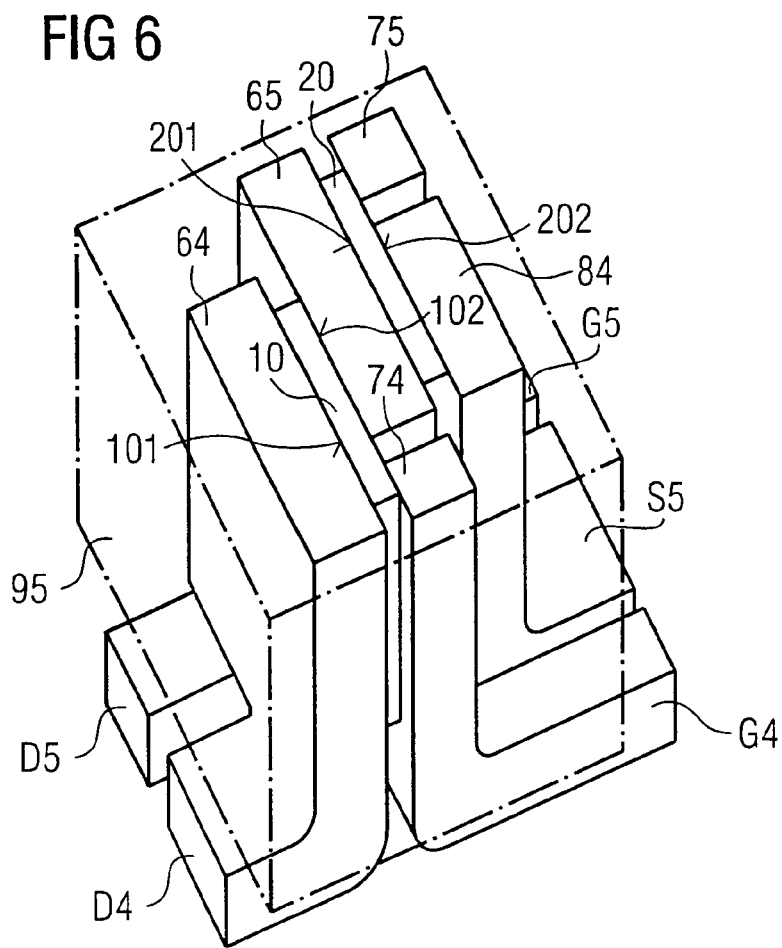
FIG. 6 illustrates a perspective illustration of a further exemplary embodiment of a semiconductor component according to the invention.
Figure 7:
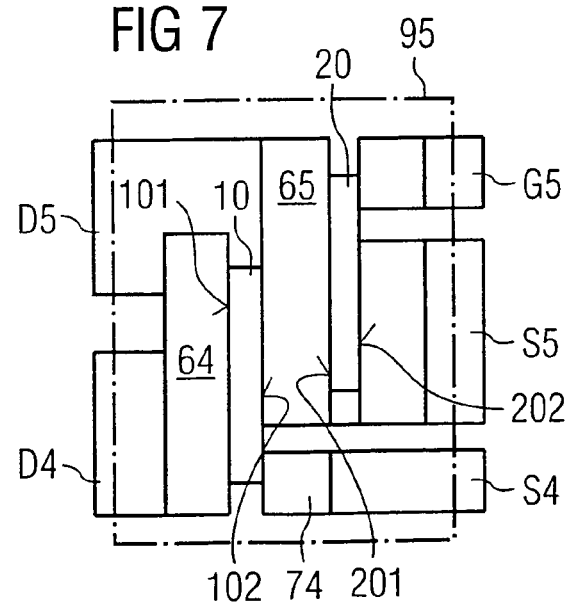
FIG. 7 illustrates a plan view of the semiconductor component in accordance with FIG. 6.
Figure 8:
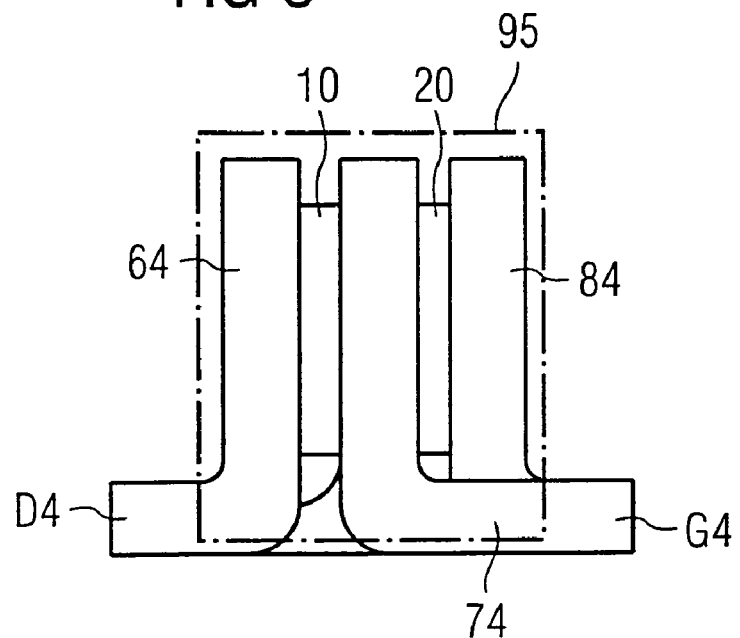
FIG. 8 illustrates a side view of the semiconductor component in accordance with FIGS. 6 and 7.

FIGS. 6–8 illustrate a further exemplary embodiment of a semiconductor component according to the invention, FIG. 6 showing the component in a perspective illustration, FIG. 7 showing the component in plan view and FIG. 8 showing the component in side view. The component comprises two semiconductor chips 10, 20, which in each case have a front side 102, 202 and a rear side 101, 201. In the exemplary embodiment, the semiconductor chips 10, 20 are likewise formed as transistor chips and in each case comprise a drain connection area at the rear side 101, 201 thereof and also a source connection area and a gate connection area at the front side 102, 202 thereof.

In one embodiment, the semiconductor chips 10, 20 are arranged in such a way that the front side 102 of the first semiconductor chip 10 faces the rear side 201 of the second semiconductor chip 20, a common contact clip 65, which is arranged between the semiconductor chips 10, 20, making contact with a drain contact area at the rear side 201 of the second semiconductor chip 20 and a source contact area at the front side 102 of the first semiconductor chip 10. Said contact clip 65 is formed in plate-type fashion in order to produce a maximum-area contact with the source contact area of the semiconductor chip 20 and the drain contact area of the semiconductor chip 10, and projects from the housing at an underside 95, the contact clip 65 being angled in the region of the underside of the housing 95. The section D5 of the contact clip 65 that projects from the housing forms a connection leg for a common connection of the source contact of the semiconductor chip 20 and of the drain contact of the semiconductor chip 10.

A further large-area contact clip 64 makes contact with the drain contact area of the first semiconductor chip 10 at the rear side 101, which contact clip likewise exits from the housing 95 at the underside and has a connection leg D4, which runs in sections parallel to the connection leg D5 of the contact clip 65 lying between the chips 10, 20.

A gate contact clip 74 makes contact with a gate contact area at the front side 102 of the first semiconductor chip 100. In order to prevent this gate contact clip 74 from also making contact with the semiconductor chip 20, the two semiconductor chips are arranged parallel in a manner displaced with respect to one another in the housing 95.

A source contact clip 84 makes contact with a gate contact area at the front side 202 of the semiconductor chip 20, which source contact clip likewise projects from the housing 95 at the underside. In a corresponding manner, a gate contact clip 74 makes contact with a gate contact area at the front side 202 of the second semiconductor chip 20, which gate contact clip largely runs parallel to the source contact clip 84.

Figure 9:
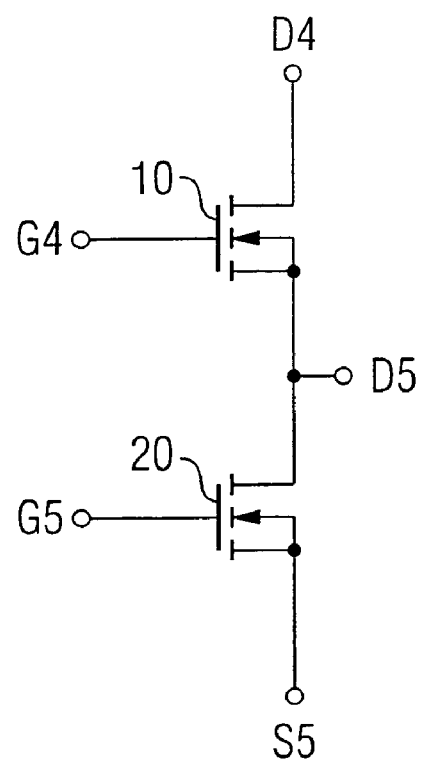
FIG. 9 illustrates an electrical equivalent circuit diagram of the semiconductor component in accordance with FIGS. 6–8 when using transistor chips.

FIG. 9 illustrates the electrical equivalent circuit diagram of the semiconductor component in accordance with FIGS. 6–8. This component with two semiconductor chips 10, 20 in each of which a power MOSFET is integrated, for example, realizes a half-bridge in a space-saving, compact manner, it being possible to make contact with gate terminals of the transistors 10, 20 separately via the gate connection legs G4, G5. The drain terminal of the transistor 20 is connected to the source terminal of the transistor 10, it being possible to make contact with these two terminals via the common connection leg D5. It is furthermore possible to make contact externally with the source terminal of the transistor 20 via the connection leg S5 and with the drain terminal of the transistor 10 via the connection leg G4.

In addition to transistor chips, it is possible, of course, to use any other semiconductor chips desired. Power chips, such as power diode chips may be used. With reference to the exemplary embodiment in accordance with FIGS. 1–3, power diodes can be connected in parallel in a simple manner if the transistor chips are replaced by power diode chips in which a cathode contact area is present instead of a drain contact area and an anode contact area is present instead of a source contact area, and in which a gate terminal is dispensed with.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
   a housing;
   at least two semiconductor chips arranged in the housing, wherein each chip has a front side and a rear side and wherein each chip has at least one contact area at the front or rear side; and
   at least one contact clip within the housing, which projects from the housing, which has a plate-type section with a first and a second connection area that are opposite one another, and which makes contact with at least two of the chips, its first connection area being applied to the contact area of a first of the at least two chips and its second connection area being applied to the contact area of a second of the at least two chips, wherein the contact clip electrically connects the contact area of the first of the at least two chips and the second of the at least two chips.

2. The semiconductor of claim 1, wherein each chip has at least one contact area at the front and rear side.

3. The semiconductor component of claim 1, wherein the housing has a top side and an underside, the areas of which are greater than remaining front and rear side areas of the housing, the at least two chips being accommodated in the housing in such a way that their front and rear sides are at least approximately perpendicular to the top side and underside.

4. The semiconductor component of claim 3, wherein the at least one contact clip exits from the housing at a side adjoining the underside and has a bent section which, below the underside, forms a connection contact.

5. The semiconductor component of claim 3, wherein the at least one contact clip exits from the housing at the underside.

6. The semiconductor component of claim 1, wherein power transistors are integrated in the at least two chips, which in each case have three contact areas: a gate contact area, a source contact area and a drain contact area.

7. The semiconductor component of claim 6, wherein the gate contact areas and the source contact areas are formed in each case at the front side and the drain contact areas are formed in each case at the rear side of the chips.

8. The semiconductor component of claim 1, wherein the at least one contact clip makes contact with contact areas either at the rear sides or at the front sides of the at least two chips.

9. The semiconductor component of claim 1, wherein the at least one contact clip makes contact with a contact area at the front side of the at least one of the chips and at the rear side of the at least one other of the chips.

10. The semiconductor component of claim 1, wherein power transistors are integrated in the first and second semiconductor chips, and wherein each power transistor has a gate contact area, a source contact area, and a drain contact area.

11. The semiconductor component of claim 10, wherein the gate contact areas and the source contact areas are formed at the front side and the drain contact areas are formed at the rear side of the semiconductor chips.

12. A semiconductor component comprising:
a housing with a top side, an underside, a first side, and a second side;
a first semiconductor chip configured within the housing, the first semiconductor chip having a front side, a rear side, and a contact area at the front side;
a second semiconductor chip configured within the housing, the second semiconductor chip having a front side, a rear side, and a contact area at the front side; and
a contact clip within the housing, wherein the contact clip projects from the housing and has a plate-type section with a first connection area and a second connection area opposite the first connection area, wherein the first connection area makes contact with the contact area of the first semiconductor chip, wherein the second connection area is applied to the contact area of the second semiconductor chip, and wherein the contact clip electrically connects the contact area of the first semiconductor chip and the contact area of the second semiconductor chip.

13. The semiconductor component of claim 12 wherein the area of the top side and underside of the housing is greater than the area of the sides of the housing and wherein the first and second semiconductor chips are accommodated in the housing such that their front and rear sides are approximately perpendicular to the top side and underside of the housing.

14. The semiconductor component of claim 12, wherein the contact clip exits from the housing at a first side and includes a bent section which, below the underside, forms a connection contact.

15. The semiconductor component of claim 14, wherein the contact clip exits from the housing at the underside.

16. A semiconductor component comprising:
a housing with a top side, an underside, a first side, and a second side;
a first semiconductor chip configured within the housing, the first semiconductor chip having a front side, a rear side, and a contact area;
a second semiconductor chip configured within the housing, the second semiconductor chip having a front side, a rear side, and a contact area; and
a contact clip within the housing, wherein the contact clip projects from the housing and has a plate-type section with a first connection area and a second connection area opposite the first connection area, wherein the first connection area makes contact with the contact area of the first semiconductor chip, wherein the second connection area is applied to the contact area of the second semiconductor chip, and wherein the contact clip electrically connects the contact area of the first semiconductor chip and the contact area of the second semiconductor chip.

17. The semiconductor component of claim 16, wherein the contact area of the first semiconductor is at the front side and the contact area of the second semiconductor is at the rear side.

18. The semiconductor component of claim 16, wherein the contact area of the first semiconductor is at the rear side and the contact area of the second semiconductor is at the rear side.

* * * * *